(12) United States Patent
Matsunaga

(10) Patent No.: US 9,728,599 B1
(45) Date of Patent: Aug. 8, 2017

(54) SEMICONDUCTOR DEVICE

(71) Applicant: FUJI ELECTRIC CO., LTD., Kawasaki-shi, Kanagawa (JP)

(72) Inventor: Shinichiro Matsunaga, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/150,703

(22) Filed: May 10, 2016

(51) Int. Cl.
*H01L 29/66* (2006.01)
*H01L 29/06* (2006.01)
*H01L 29/739* (2006.01)
*H01L 29/10* (2006.01)

(52) U.S. Cl.
CPC ........ *H01L 29/0623* (2013.01); *H01L 29/063* (2013.01); *H01L 29/1095* (2013.01); *H01L 29/7395* (2013.01)

(58) Field of Classification Search
None
See application file for complete search history.

(56) References Cited

U.S. PATENT DOCUMENTS

| 6,570,185 B1 | 5/2003 | Tan |
| 2008/0012026 A1 | 1/2008 | Tsuji |
| 2009/0114923 A1 | 5/2009 | Iwamuro |

FOREIGN PATENT DOCUMENTS

| JP | 2008-016747 A | 1/2008 |
| JP | 5054255 B2 | 8/2012 |
| JP | 5444608 B2 | 1/2014 |

*Primary Examiner* — Julio J Maldonado
*Assistant Examiner* — Stanetta Isaac
(74) *Attorney, Agent, or Firm* — Rabin & Berdo, P.C.

(57) ABSTRACT

An edge termination structure that surrounds an active region is disposed outside the active region. In the active region, a MOS gate structure is disposed. Inside an $n^-$-type drift layer, an n-type CS region that becomes a minority carrier barrier is disposed in a surface layer on a $p^+$-type base layer side. The n-type CS region is disposed in the active region and is not disposed in the edge termination structure. Thus, the impurity concentration of the $n^-$-type drift layer inside the edge termination structure is low enough to enable high breakdown voltage to be realized. In the $n^-$-type drift layer, which has a low impurity concentration, a JTE structure that is formed from first and second JTE regions is disposed.

7 Claims, 8 Drawing Sheets

SEMICONDUCTOR DEVICE

CROSS REFERENCE TO RELATED APPLICATIONS

This application is based upon the prior Japanese Patent Application No. 2014-228117, filed on Nov. 10, 2014, the entire contents of which are incorporated herein by reference.

BACKGROUND OF THE INVENTION

1. Field of the Invention

The embodiments discussed herein are related to a semiconductor device.

2. Description of the Related Art

Insulated gate bipolar transistors (IGBT) have an advantage of low ON resistance consequent to the effects of conductivity modulation. Conventionally, to efficiently facilitate low ON resistance by the effects of conductivity modulation, an IGBT is commonly known in which a carrier storage (CS) layer that is of the same conductivity type as the drift layer and has a higher impurity concentration than the drifter layer, is disposed at a base front surface side inside the drift layer. The carrier storage layer becomes a barrier of minority carriers and the minority carrier storage effect becomes high, whereby current density between the collector and emitter increases and the conductivity modulation effect increases.

Further, concerning metal oxide semiconductor field effect transistors (MOSFET), a technique of facilitating low ON resistance by increasing the impurity concentration of a portion that is near a channel and on a base front surface side inside the drift layer is commonly known. In a MOSFET, a CS layer disposed at a base front surface side inside the drift layer functions as a carrier spread layer, and so-called junction FET (JFET) resistance decreases and ON resistance drops. Hereinafter, the carrier storage layer and the carrier spread layer will be collectively referred to as "CS layer".

Concerning the structure of a semiconductor device that has a CS layer, an IGBT of a planar gate structure will be described. FIG. 9 is a cross-sectional view of a structure of an edge termination structure of a conventional semiconductor device that has a CS layer. An edge termination structure 122 is disposed at an outer side of an active region 121, is a region that surrounds the active region 121, and has a function of relaxing the electric field of an $n^-$-type drift layer 102 at a base front surface side to maintain the breakdown voltage. The active region 121 is a region in which current flows during an ON state. As depicted in FIG. 9, a conventional semiconductor device is created using an epitaxial base formed by the $n^-$-type drift layer 102, an n-type CS layer 103, and a $p^+$-type base layer 104 that are epitaxially grown and sequentially stacked on a front surface of a $p^+$-type semiconductor substrate 101. In other words, the n-type CS layer 103 is disposed between the $n^-$-type drift layer 102 and the $p^+$-type base layer 104.

Further, the n-type CS layer 103 is disposed from the active region 121, across the edge termination structure 122. In the edge termination structure 122, a groove 113 is disposed that penetrates the $p^+$-type base layer 104 in a direction of depth and reaches the n-type CS layer 103. A junction termination extension (JTE) structure that abuts an end portion of the $p^+$-type base layer 104 is disposed at a portion the n-type CS layer 103, the portion exposed at a bottom of the groove 113. The JTE structure is formed by a p-type region (first and second JTE regions 114, 115) that has a lower impurity concentration than the $p^+$-type base layer 104. Reference numerals 107, 110, and 112 denote a $p^{++}$-type contact region, an interlayer insulating film, and a collector electrode, respectively.

As a device that facilitates low ON resistance by disposing a CS layer in such a manner, a MOS-type semiconductor device of a drain gate structure produced (manufactured) using a semiconductor that has a wider bandgap than silicon (Si) (hereinafter, wide-bandgap semiconductor) has been proposed (for example, refer to Japanese Patent Application Laid-Open Publication No. 2008-16747 (paragraphs 0018 to 0019 and FIG. 5), Japanese Patent No. 5444608 (paragraphs 0016 to 0017 and FIGS. 1, 2), and Japanese Patent No. 5054255 (line 32 of page 14 to line 14 of page 15 and FIG. 20)). In Japanese Patent Application Laid-Open Publication No. 2008-16747, and Japanese Patent Nos. 5444608 and 5054255, a CS layer formed from an epitaxial layer is disposed inside the drift layer, near an interface with the base layer and at a depth that from the base front surface, is shallower than the trench bottom portion.

In particular, when a semiconductor device is produced (manufactured) using a wide-bandgap semiconductor such as silicon carbide (SiC), since the control of the impurity concentration and thickness is relatively easy, deposition of the CS layer by epitaxial growth is common such as in Japanese Patent Application Laid-Open Publication No. 2008-16747, and Japanese Patent Nos. 5444608 and 5054255. However, in such cases, the CS layer is further formed in the edge termination structure surrounding the active region. When the CS layer is formed in the edge termination structure, the impurity concentration of the CS layer may become 10 to several 100 times greater than that of the drift layer, whereby the JTE structure disposed in the edge termination structure may be adversely affected and the maximum breakdown voltage of the edge termination structure may drop. The breakdown voltage of the overall device drops consequent to the maximum breakdown voltage of the edge termination structure dropping.

SUMMARY OF THE INVENTION

According to one aspect of the present invention, a semiconductor device has an edge termination structure outside an active region in which current flows. The semiconductor device includes a drift layer that is a first conductivity type and has a first surface and a second surface; a semiconductor device structure that is disposed on a first surface side of the drift layer; and a high concentration region that is the first conductivity type, that has an impurity concentration that is higher than that of the drift layer, and that is selectively disposed in the active region and on a device structure side inside the drift layer. The high concentration region is not disposed in the edge termination structure.

In the semiconductor device, the high concentration region is a barrier region that suppresses movement of minority carriers that move from a second surface side of the drift layer, toward the first surface side.

In the semiconductor device, the high concentration region is a spread region that spreads in a direction parallel to the first surface of the drift layer, carriers that move from the first surface side of the drift layer, toward a second surface side.

In the semiconductor device, the device structure includes a second-conductivity-type semiconductor region that is disposed on the first surface of the drift layer; a first-conductivity-type semiconductor region that is disposed inside the second-conductivity-type semiconductor region; a gate insulating film that is disposed contacting a portion of the second-conductivity-type semiconductor region, the portion between the drift layer and the first-conductivity-type semiconductor region; and a gate electrode that is disposed sandwiching the gate insulating film, on an opposite side of the first-conductivity-type semiconductor region. The high concentration region is disposed near an interface with the second-conductivity-type semiconductor region.

The other objects, features, and advantages of the present invention are specifically set forth in or will become apparent from the following detailed description of the invention when read in conjunction with the accompanying drawings.

DETAILED DESCRIPTION OF THE INVENTION

Figure 1:
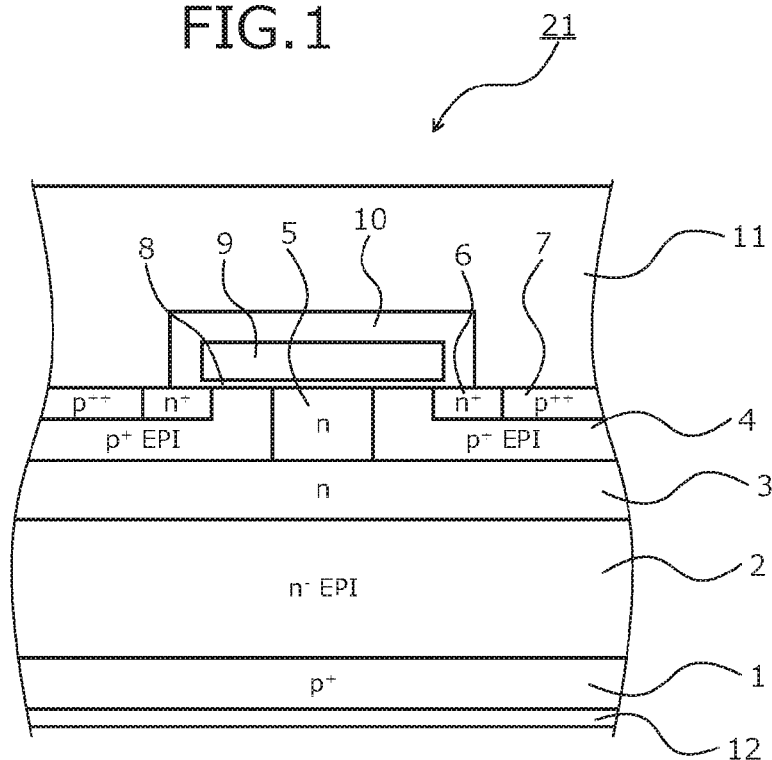
FIG. 1 is a cross-sectional view of a structure of an active region of a semiconductor device according to an embodiment.

Preferred embodiments of a semiconductor device will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Embodiment

Figure 2:
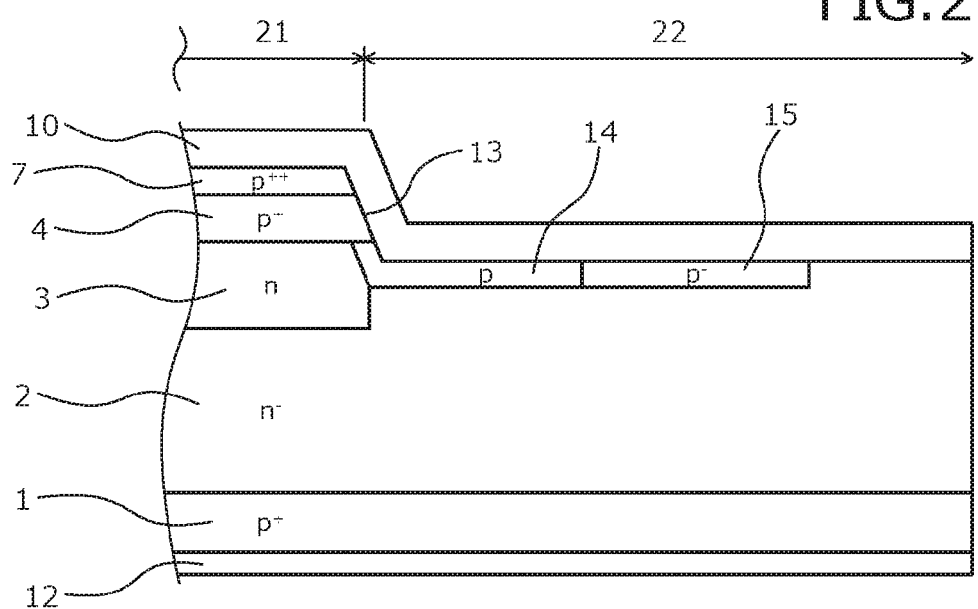
FIG. 2 is a cross-sectional view of a structure of an edge termination structure of the semiconductor device according to the embodiment.

Concerning a structure of the semiconductor device according to an embodiment, an IGBT of a planar gate structure will be described as an example. FIG. 1 is a cross-sectional view of a structure of an active region of the semiconductor device according to the embodiment. FIG. 2 is a cross-sectional view of a structure of an edge termination structure of the semiconductor device according to the embodiment. As depicted in FIGS. 1 and 2, the semiconductor device according to the embodiment has an edge termination structure 22 located outside the active region 21 in which current flows during an ON state, the edge termination structure 22 being disposed so as to surround the active region 21. The edge termination structure 22 has a function of relaxing electric field of an n$^-$-type drift layer 2, on a base front surface (first surface) side thereof, and maintaining the breakdown voltage. Further, the semiconductor device according to one embodiment is created using an epitaxial base (semiconductor chip) formed by the n$^-$-type drift layer 2 and a p$^+$-type base layer 4 epitaxially grown and sequentially stacked on a front surface of a p$^+$-type semiconductor substrate 1 that becomes a p$^+$-type collector layer.

In the active region 21, inside the n$^-$-type drift layer 2, an n-type CS region (high concentration region) 3 formed from an n-type diffusion region is disposed in a surface layer on a p$^+$-type base layer 4 side. The n-type CS region 3 is disposed so as to contact the p$^+$-type base layer 4 deposited on the n$^-$-type drift layer 2. In other words, the n-type CS region 3 is disposed so as to cover a lower side (n$^-$-type drift layer 2 side) of the p$^+$-type base layer 4, near an interface with the p$^+$-type base layer 4, inside the n$^-$-type drift layer 2. Further, the n-type CS region 3 is disposed only in the active region 21 and is not disposed in the edge termination structure 22. In other words, with the disposal of the n-type CS region 3 inside the n$^-$-type drift layer 2, the impurity concentration of the base front surface side of the n$^-$-type drift layer 2 becomes high in the active region 21 alone.

The n-type CS region 3 becomes a barrier of minority carriers (electron holes) during the ON state. Therefore, the n-type CS region 3 has a function of a carrier storage region that suppresses the pulling out of minority carriers implanted in the n$^-$-type drift layer 2, from a collector side to an emitter side and increases the effect of minority carrier storage. Therefore, disposal of the n-type CS region 3 enables the current density of the n$^-$-type drift layer 2 to be increased and the conductivity modulation effect to be enhanced. The n-type CS region 3 may extend parallel to the base front surface, for example, across the entire active region 21 so as to cover a lower side of a JFET region 5 described hereinafter and the p$^+$-type base layer 4.

In a front surface side (p$^+$-type base layer 4 side) of the epitaxial base, a metal oxide film semiconductor (MOS) gate (insulated gate formed from a MOS) structure (semiconductor device structure) is disposed. The MOS gate is formed by the p$^+$-type base layer 4, the JFET region 5, an n$^+$-type emitter region (first-conductivity-type semiconductor region) 6, a p$^{++}$-type contact region 7, a gate insulating film 8, and a gate electrode 9. More specifically, the n-type JFET region 5 that penetrates the p$^+$-type base layer 4 in a direction of depth and reaches the n-type CS region 3 is disposed inside the p$^+$-type base layer 4. The impurity concentration of the JFET region 5 is higher than the impurity concentration of the n$^-$-type drift layer 2. The JFET region 5 has a function of reducing the JFET resistivity and reducing the ON resistance. A channel along the gate electrode 9 is formed in a portion (second-conductivity-type semiconductor region) of the p$^+$-type base layer 4 excluding the JFET region 5.

Further, the n$^+$-type emitter region 6 and the p$^{++}$-type contact region 7 are each selectively disposed inside the p$^+$-type base layer 4. The n$^+$-type emitter region 6 and the p$^{++}$-type contact region 7 are arranged away from the JFET region 5. The p$^{++}$-type contact region 7 is arranged at a position that is farther away from the JFET region 5 than the n$^+$-type emitter region 6 and contacts the n$^+$-type emitter region 6. On a surface of the p$^+$-type base layer 4, at a portion between the JFET region 5 and the n$^+$-type emitter region 6, the gate insulating film 8 is disposed from a surface of the JFET region 5, across a surface of the n$^+$-type emitter region 6. The gate electrode 9 is disposed on a surface of the gate insulating film 8. An interlayer insulating film 10 is disposed so as to cover the gate electrode 9.

The interlayer insulating film 10 is disposed on a front surface of the epitaxial base, from the active region 21, across the edge termination structure 22. The n$^+$-type emitter region 6 and the p$^{++}$-type contact region 7 are exposed in a contact hole that penetrates the interlayer insulating film 10 in a direction of depth. An emitter electrode 11 contacts the n⁺-type emitter region 6 and the p⁺⁺-type contact region 7 through the contact hole that penetrates the interlayer insulating film 10 in the direction of depth, and is electrically insulated from the gate electrode 9 by the interlayer insulating film 10. A collector electrode 12 is disposed in a back surface of the epitaxial base (i.e., a back surface of the p⁺-type semiconductor substrate 1), from the active region 21, across the edge termination structure 22.

In the edge termination structure 22, a JTE structure formed from a p-type region that has a lower impurity concentration than the p⁺-type base layer 4 is disposed on a front surface side of the epitaxial base. The JTE structure has a function of relaxing the electric field in the edge termination structure 22. As described, since the n-type CS region 3 is disposed in the edge termination structure 22, the impurity concentration of the n⁻-type drift layer 2 in the edge termination structure 22 is low enough to enable high breakdown voltage to be realized. The JTE structure is disposed in the n⁻-type drift layer 2, which has a low impurity concentration. The JTE structure, for example, may be a double zone JTE structure formed by a p-type region (hereinafter, first JTE region) 14 and p⁻-type region (hereinafter, second JTE region) 15 that have differing impurity concentrations and are arranged continuously in a direction from an active region 21 side toward an outer side, so as to contact each other.

More specifically, in the edge termination structure 22, a groove 13 is disposed that penetrates the p⁺-type base layer 4 in a direction of depth and reaches the n⁻-type drift layer 2, and the n⁻-type drift layer 2 is exposed at substantially the entire base front surface. In a surface layer of a portion of the n⁻-type drift layer 2 exposed at a bottom of the groove 13, for example, the first and second JTE regions 14, 15 are selectively disposed concentrically and surround the active region 21. The first JTE region 14 is disposed at a side that is farthest inward of the edge termination structure 22 and the first JTE region 14 contacts an end portion of the n-type CS region 3 and the p⁺-type base layer 4. The second JTE region 15 is disposed farther outward than the first JTE region 14 and contacts the first JTE region 14.

Figure 3:
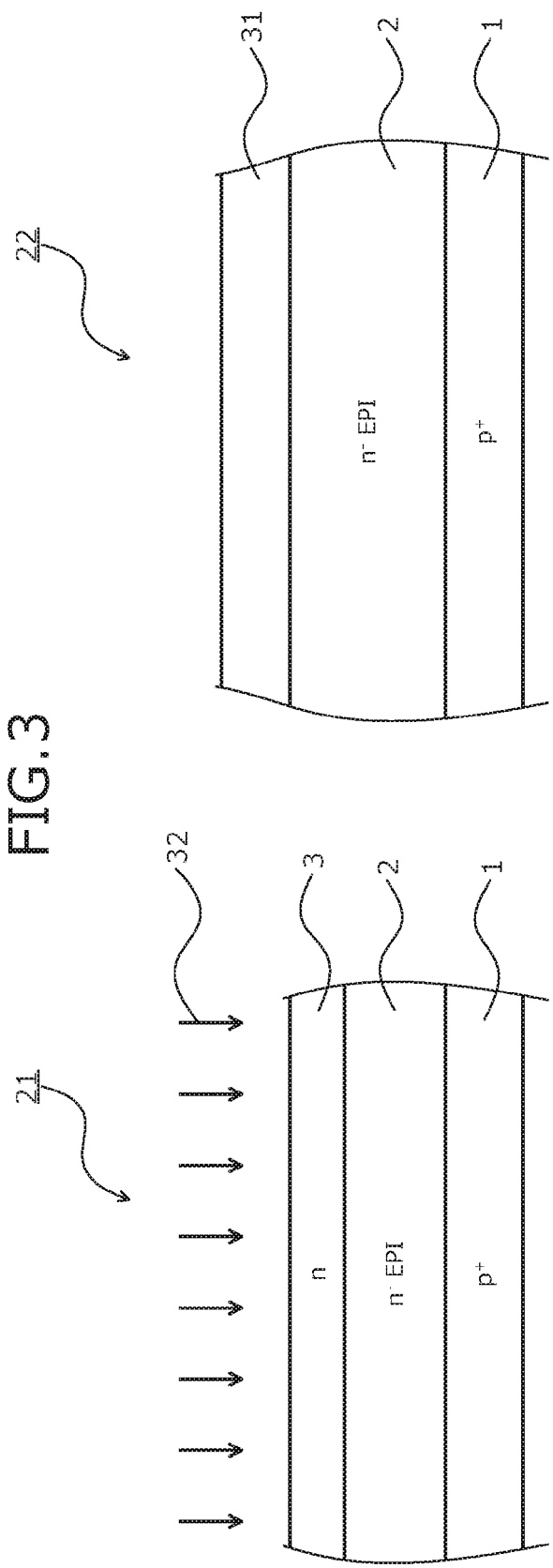
FIGS. 3, 4, 5, 6, 7, and 8 are cross-sectional views of the semiconductor device according to the embodiment during manufacture.

Concerning a method of manufacturing the semiconductor device according to the embodiment, for instance, a case where an IGBT having a breakdown voltage rating of 13 kV is produced (manufactured) will be described as an example. FIGS. 3, 4, 5, 6, 7, and 8 are cross-sectional views of the semiconductor device according to the embodiment during manufacture. FIGS. 3 to 8 depict a state of the active region 21 and a state of the edge termination structure 22. Further, in FIGS. 3 and 5 to 7, arrows representing ion implantation are depicted only at an opening of an ion implantation mask. As depicted in FIG. 3, first, as a starting substrate, the p⁺-type semiconductor substrate (semiconductor wafer) 1 that becomes a p⁺-type collector layer is prepared. The impurity concentration of the p⁺-type semiconductor substrate 1, for example, may be about $1 \times 10^{18}/cm^3$. Next, the n⁻-type drift layer 2 is deposited in the front surface of the p⁺-type semiconductor substrate 1, by epitaxial growth. The impurity concentration of the n⁻-type drift layer 2, for example, may be about $1 \times 10^{15}/cm^3$.

Next, an ion implantation mask 31 that is open at a portion that corresponds to a formation region of the active region 21 is formed in the surface of the n⁻-type drift layer 2. In other words, a portion that corresponds to a formation region of the edge termination structure 22 is covered by the ion implantation mask 31. Next, ion implantation 32 of an n-type impurity is performed using the ion implantation mask 31 as a mask and the impurity concentration of the surface layer of the n⁻-type drift layer 2 is made high, whereby the n-type CS region 3 of a depth of, for example, about 2 µm from the surface of the n⁻-type drift layer 2 is formed. The impurity concentration of the n-type CS region 3, for example, may be about $1 \times 10^{16}/cm^3$ or greater and $1 \times 10^{17}/cm^3$ or less. Here, the edge termination structure 22 is covered by the ion implantation mask 31 and therefore, the n-type CS region 3 is not formed in the edge termination structure 22. Next, the ion implantation mask 31 is removed.

Figure 4:
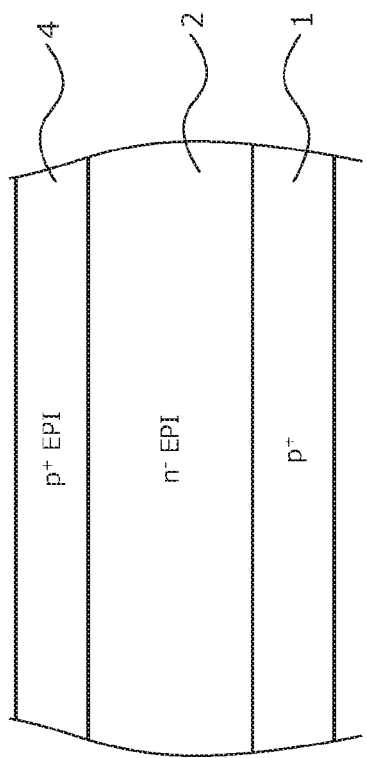
Figure 4:
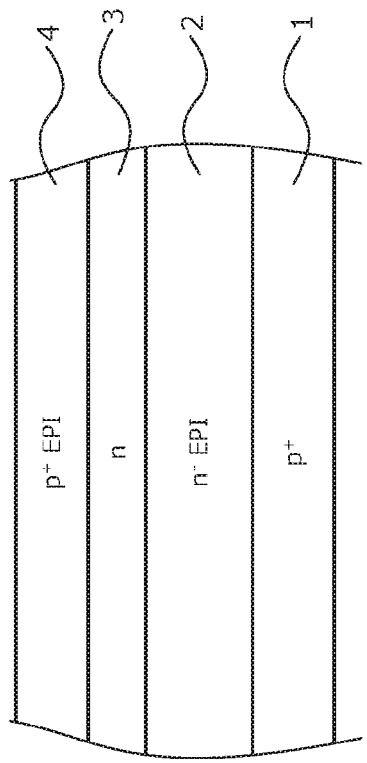
Figure 5:
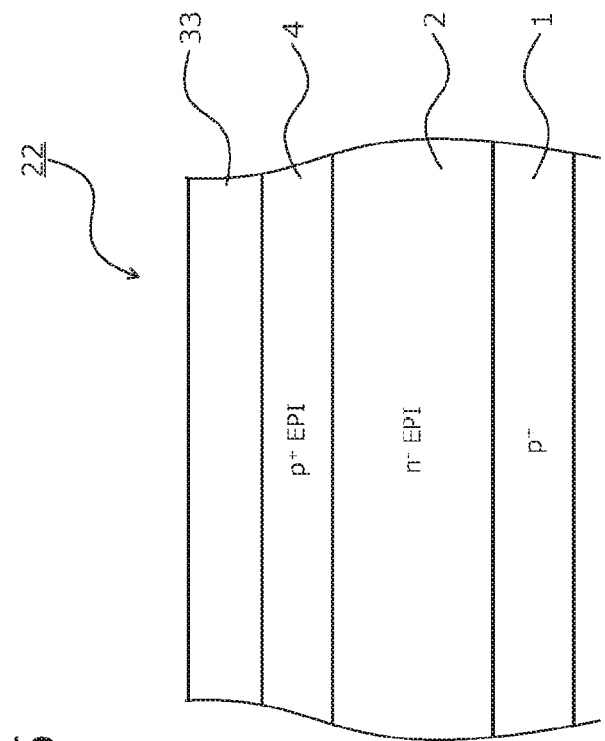
Figure 5:
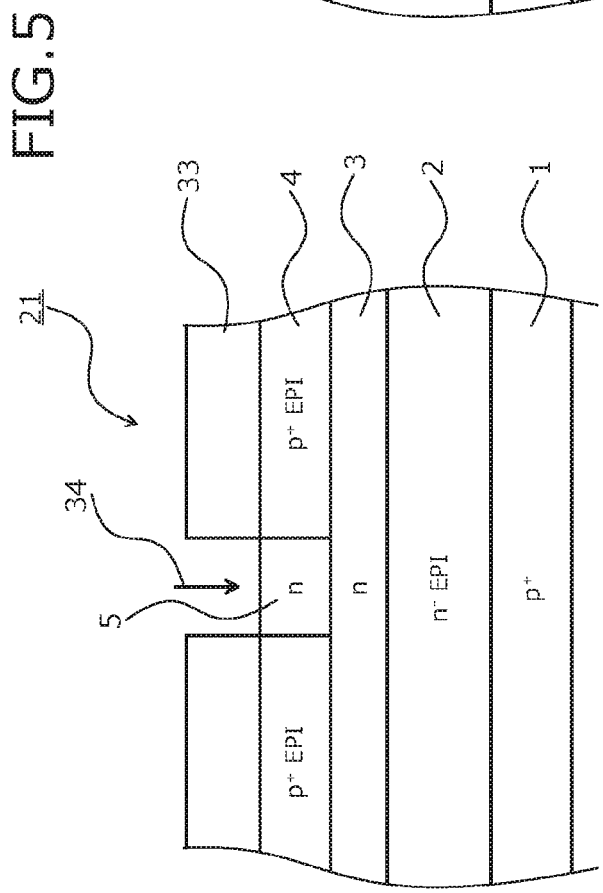

As depicted in FIG. 4, the p⁺-type base layer 4 is deposited in the surface of the n-type CS region 3 and the n⁻-type drift layer 2, by epitaxial growth. By the processes thus far, the n⁻-type drift layer 2 and the p⁺-type base layer 4 are sequentially stacked on the p⁺-type semiconductor substrate 1, to form the epitaxial base (epitaxial wafer). As depicted in FIG. 5, an ion implantation mask 33 that is open at a portion that corresponds to a formation region of the JFET region 5 is formed in the surface of the p⁺-type base layer 4. Next, ion implantation 34 of an n-type impurity is performed using the ion implantation mask 33 as a mask and a portion of the p⁺-type base layer 4 is converted to an n-type (counter layer) to form the JFET region 5. Subsequently, the ion implantation mask 33 is removed.

Figure 6:
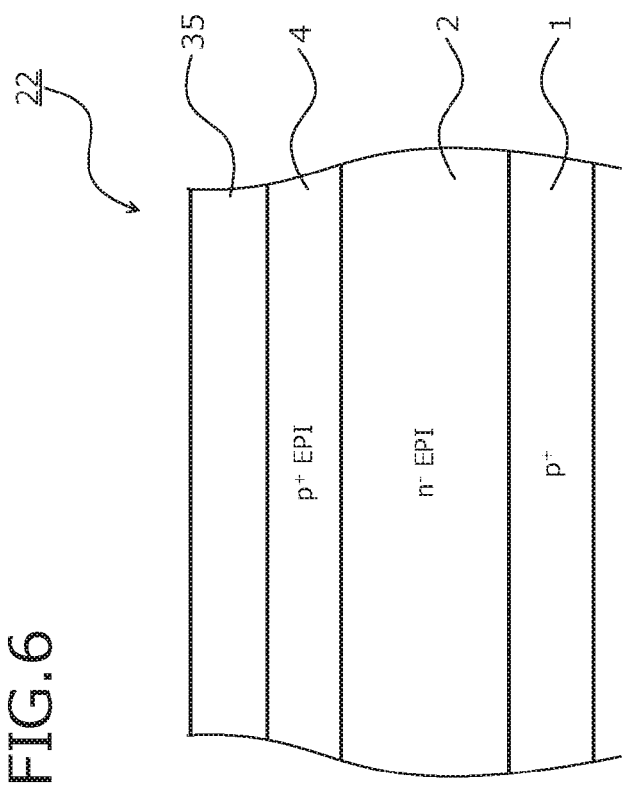
Figure 6:
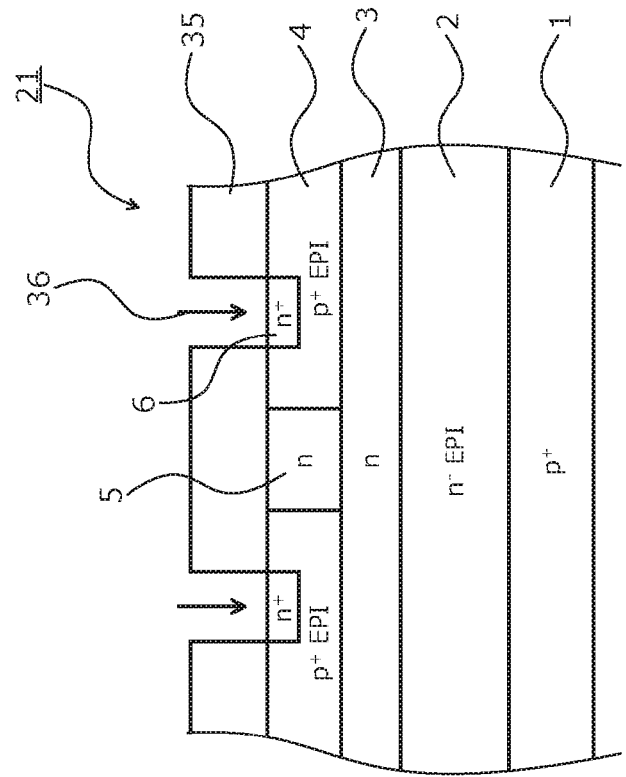
Figure 7:
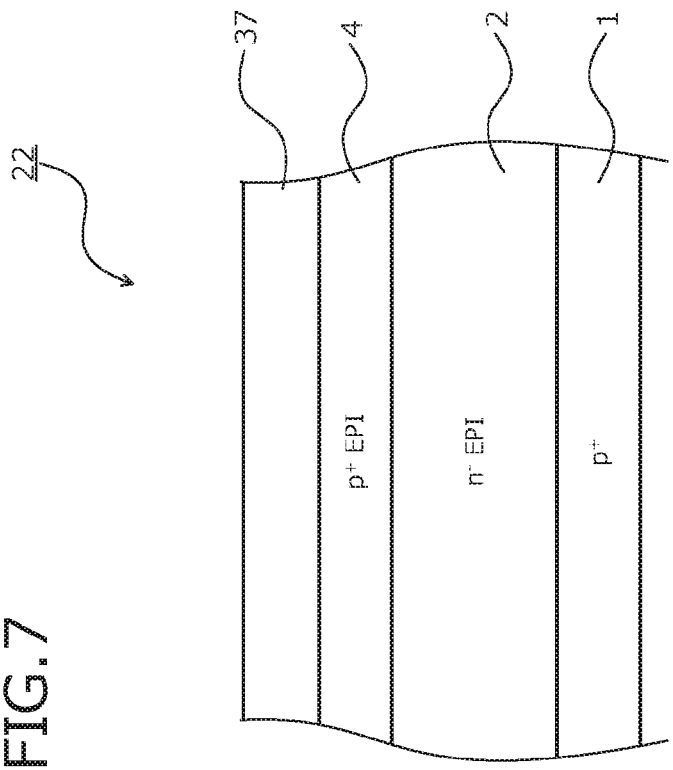
Figure 7:
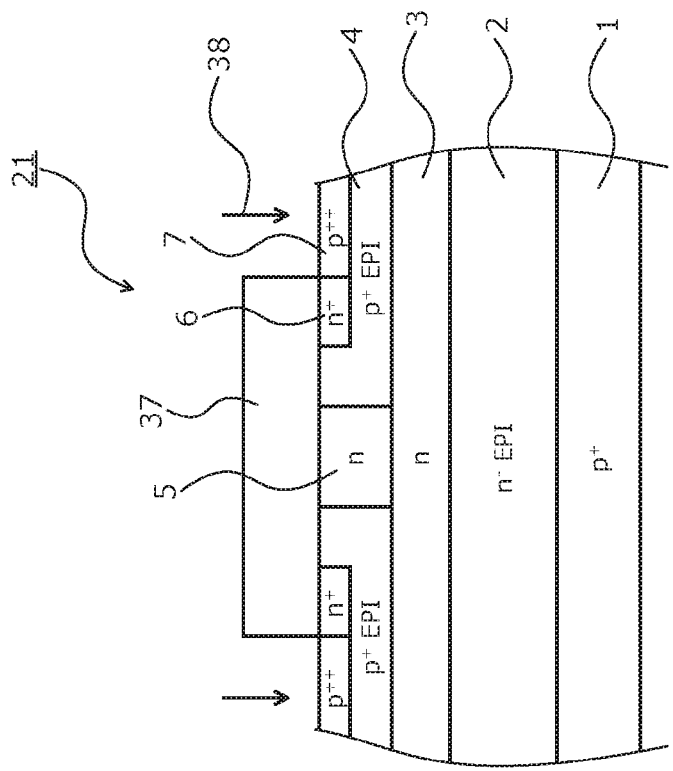

As depicted in FIG. 6, an ion implantation mask 35 that is open at a portion that corresponds to a formation region of the n⁺-type emitter region 6 is formed. Ion implantation 36 of an n-type impurity is performed using the ion implantation mask 35 as a mask and the n⁺-type emitter region 6 is formed in the surface layer of the p⁺-type base layer 4. Subsequently, the ion implantation mask 35 is removed. As depicted in FIG. 7, an ion implantation mask 37 open at a portion that corresponds to a formation region of the p⁺⁺-type contact region 7 is formed. Ion implantation 38 of a p-type impurity is performed using the ion implantation mask 37 as a mask and the p⁺⁺-type contact region 7 is formed in the surface layer of the p⁺-type base layer 4. Subsequently, the ion implantation mask 37 is removed.

After formation of the p⁺-type base layer 4 and before activation annealing described hereinafter, at a predetermined timing, the JTE structure is formed in the edge termination structure 22. More specifically, for example, an etching mask (not depicted) that is open at a portion that corresponds to a formation region of the edge termination structure 22 is formed in the surface of the p⁺-type base layer 4. Etching that uses this etching mask as a mask is performed, a portion of p⁺-type base layer 4 corresponding to the edge termination structure 22 is removed (i.e., the groove 13 is formed in the edge termination structure 22), and the n⁻-type drift layer 2 is exposed at the edge termination structure 22. In this etching, the surface of the n⁻-type drift layer 2 and the p⁺-type base layer 4 may be removed and, for example, the n-type CS region 3 on the active region 21 side of the groove 13 may be exposed. A process of selective ion implantation of a p-type impurity may be repeatedly performed and the first and second JTE regions 14, 15 may be selectively formed in the surface layer of the n⁻-type drift layer 2 (refer to FIGS. 2 and 8).

Figure 8:
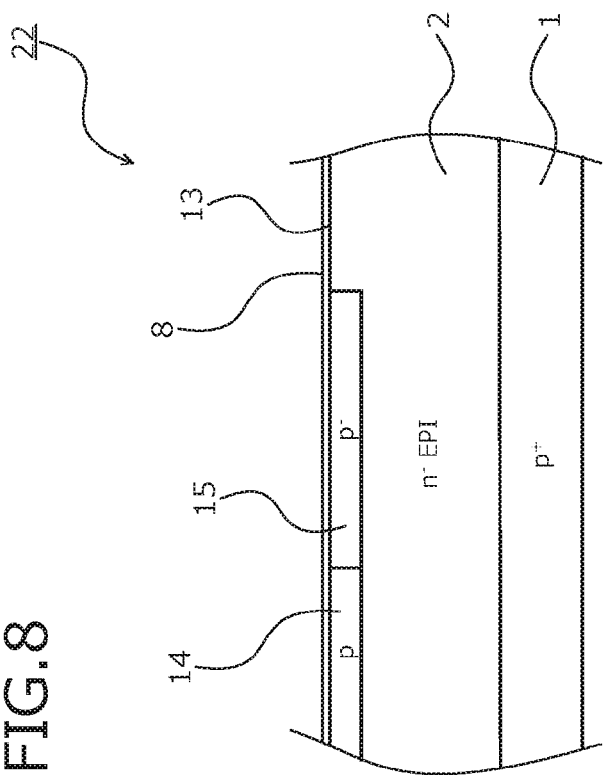
Figure 8:
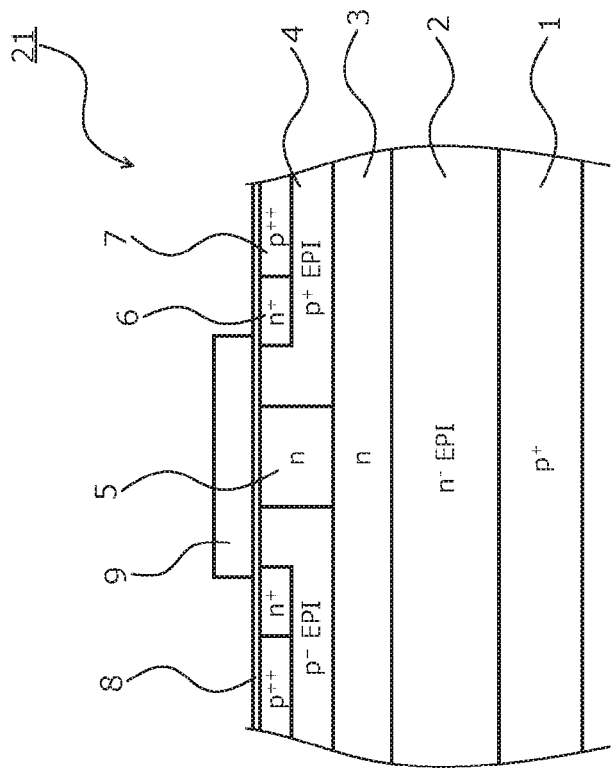

The sequence of the ion implantations for forming the JFET region 5, the n⁺-type emitter region 6, the p⁺⁺-type contact region 7, and the first and second JTE regions 14, 15 described above can be modified variously. Subsequently, activation annealing (heat treatment) for activating the diffusion regions respectively formed by the ion implantations is performed. In FIGS. 5 to 8, an example is depicted where the n⁺-type emitter region 6, the p⁺⁺-type contact region, and the first and second JTE regions 14, 15 are sequentially formed. Subsequently, as depicted in FIG. 8, the front surface of (surface on the p$^+$-type base layer 4 side of) the epitaxial base is heated to form the gate insulating film 8. On the gate insulating film 8, for example, a polycrystalline silicon (poly-Si) layer is formed and patterned as the gate electrode 9.

The interlayer insulating film 10 is formed so as to cover the gate electrode 9 and is heat treated (reflow) after patterning. In the patterning of the interlayer insulating film 10, a contact hole is formed and the gate insulating film 8 exposed by the contact hole is removed, exposing the n$^+$-type emitter region 6 and the p$^{++}$-type contact region 7. Next, for example, by a sputtering method, the emitter electrode 11 is formed so as to be embedded in the contact hole. Subsequently, the collector electrode 12 is formed in the back surface of the p$^+$-type semiconductor substrate 1. Next, a protective passivation film is formed in the front surface of the epitaxial base. Thereafter, the epitaxial base is cut into chips (diced), whereby the IGBT depicted in FIGS. 1 and 2 is completed.

Further, in the described method of manufacturing the semiconductor device according to the embodiment, although an instance where the p$^+$-type base layer 4 is formed by epitaxial growth, the p$^+$-type base layer 4 may be formed by ion implantation. For example, after formation of the n-type CS region 3, ion implantation of a p-type impurity may be performed using the same ion implantation mask used in forming the n-type CS region 3 and in the surface layer of the n-type CS region 3, the p$^+$-type base layer 4 may be formed. In this case, at the edge termination structure 22, since the n$^-$-type drift layer 2 is exposed at the base front surface, when the JTE structure is formed, the groove 13 need not be formed.

Further, although an instance where the n-type CS region 3 is formed by ion implantation has been described as an example, after an n-type epitaxial layer that becomes the n-type CS region 3 is deposited in the surface of the n$^-$-type drift layer 2 by epitaxial growth, a portion of the n-type epitaxial layer may be removed, a portion outward from an interface of the active region 21 and the edge termination structure 22. In this case, after the n-type epitaxial layer that becomes the n-type CS region 3 is deposited by epitaxial growth, for example, in the surface of the n-type epitaxial layer, an etching mask that covers a portion that corresponds to a formation region of the active region 21 is formed. Etching that uses this etching mask as a mask is performed, whereby a portion that corresponds to the edge termination structure 22 of the n-type epitaxial layer is removed.

Further, application of the present invention to produce a MOSFET of a planar gate structure is possible. In this case, in the described method of manufacturing the semiconductor device according to the embodiment, in place of the p$^+$-type semiconductor substrate 1, an n$^+$-type semiconductor substrate (semiconductor wafer) that becomes an n$^+$-type drain layer is used as a starting substrate. Other than the starting substrate, conditions of the method of manufacturing a MOSFET to which the present invention is applied are identical to those for the method of manufacturing the IGBT depicted in FIGS. 1 and 2 described above. A cross-sectional structure of a MOSFET to which the present invention is applied is identical to a case where in the IGBT depicted in FIGS. 1 and 2, an n$^+$-type semiconductor substrate is disposed in place of the p$^+$-type semiconductor substrate 1. The n$^+$-type emitter region 6 and the emitter electrode 11 become an n$^+$-type source region and a source electrode, respectively. The n-type CS region 3 functions as a carrier spread region that spreads in a lateral direction (a direction parallel to the base front surface), carriers (electrons) that move from a source side, toward a drain side, inside the n$^-$-type drift layer 2 during the ON state.

Example

Figure 9:
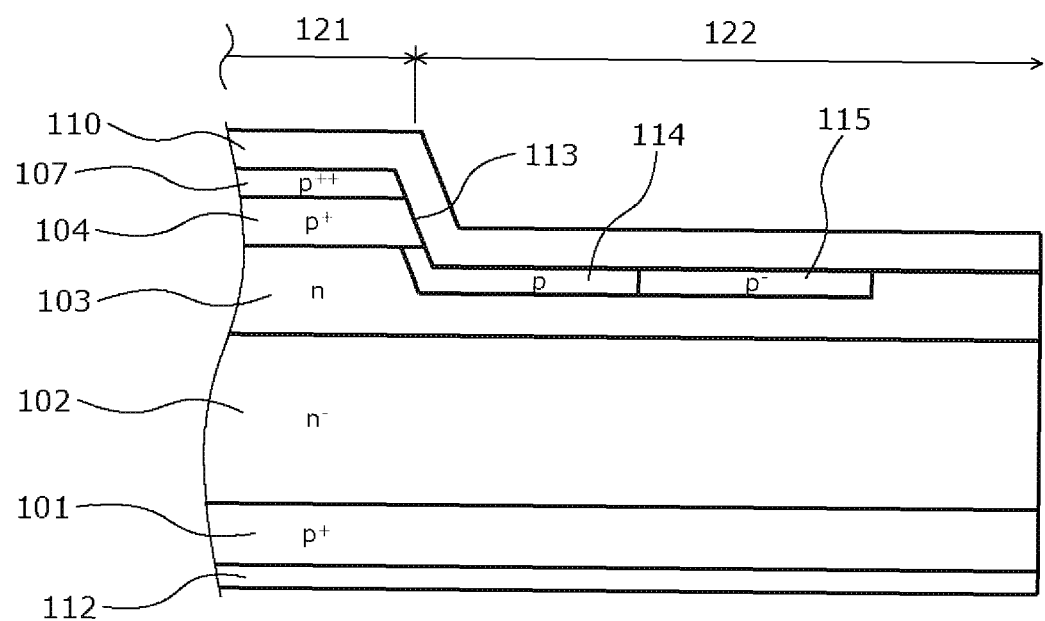
FIG. 9 is a cross-sectional view of a structure of an edge termination structure of a conventional semiconductor device that has a CS layer.

An IGBT of a planar gate structure (hereinafter, example) that has a breakdown voltage rating of 13 kV and includes the n-type CS region 3 was produced according to the described method of manufacturing the semiconductor device according to the embodiment, and the maximum breakdown voltage of the edge termination structure 22 was measured. For comparison, a conventional IGBT (refer to FIG. 9) of a planar gate structure and including the n-type CS layer 103 was produced (hereinafter, conventional example), and the maximum breakdown voltage of the edge termination structure 122 was measured. In other words, the conventional example includes the n-type CS layer 103 that is disposed from the active region 121, across the edge termination structure 122. Excluding the n-type CS layer 103, configuration of the conventional example is identical to that of the example. From the results, it was confirmed that the maximum breakdown voltage of the edge termination structure 122 of the conventional example was 15.5 kV. Meanwhile, the maximum breakdown voltage of the edge termination structure 22 of the example was 18 kV, and it was confirmed that the maximum breakdown voltage of the edge termination structure 22 could be enhanced to a greater extent than the conventional example.

As described, according to the embodiment, disposal of the n-type CS region in only the active region enables the impurity concentration of the base front surface side of the n$^-$-type drift layer in the edge termination structure to be set low enough to enable high breakdown voltage to be realized. As a result, the JTE structure can be disposed in the n$^-$-type drift layer, which has a low impurity concentration, and a decrease of the maximum breakdown voltage edge of the termination structure can be prevented. Therefore, the maximum breakdown voltage of the edge termination structure can be enhanced to a greater extent as compared to the described conventional example and breakdown voltage of the overall device can be enhanced. Further, according to the embodiment, since decreases of the maximum breakdown voltage of the edge termination structure can be prevented, the maximum breakdown voltage of the edge termination structure can be made higher than that of the active region. According to the embodiment, since the n-type CS region can be disposed inside the n$^-$-type drift layer in the active region, near an interface with the p$^+$-type base layer, low ON resistance can be facilitated as can be conventionally. In other words, in an IGBT, the n-type CS region functions as a carrier storage region, whereby the conductivity modulation effect increases and the ON resistance can be reduced. In a MOSFET, the n-type CS region functions as carrier spread region, whereby the JFET resistivity and the ON resistance can be reduced.

In the description, various design modifications can be made without departing from the spirit of the present invention and in the described embodiments. For example, dimensions, impurity concentration, etc. of components can be set according to required specifications. Further, in the described embodiments, although description is given taking a MOS-type semiconductor device of a planar gate structure as an example, when the present invention is applied to a MOS-type semiconductor device of a drain gate structure, the same effects are obtained. When the invention is applied to a MOS-type semiconductor device of a drain gate structure, the n-type CS layer suffices to be formed in the active region only and at a shallower depth from the base front surface than the trench bottom, between the drift layer and the base layer. Further, the present invention has the same effects when applied to semiconductor devices produced using a wide-bandgap semiconductor (semiconductor having a wider bandgap than silicon) such as silicon carbide (SiC). Further, in the embodiments, although description is given assuming the first conductivity type to be an n-type and the second conductivity type to be a p-type, the present invention is further applicable when the first conductivity type is assumed to be a p-type and the second conductivity type is assumed to be an n-type.

According to the described invention, the impurity concentration on the first surface side of the drift layer in the edge termination structure can be made low enough to enable high breakdown voltage to be realized. As a result, in the drift layer, which as a low impurity concentration, the JTE structure can be disposed, enabling decreases of the maximum breakdown voltage of the edge termination structure to be prevented. Further, according to the embodiment, since decreases of the maximum breakdown voltage of the edge termination structure can be prevented, the maximum breakdown voltage can be made higher than that of the active region.

The semiconductor device according to the present invention achieves an effect in that breakdown voltage can be enhanced.

As described, the semiconductor device according to the present invention is useful for semiconductor devices that include a JTE structure (reduced surface field (RESURF) structure) in the edge termination structure and is particularly, suitable for semiconductor devices that have a high breakdown voltage rating of 13 kV or greater and that are produced using a wide-bandgap semiconductor such as silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an edge termination structure outside an active region in which current flows, the semiconductor device comprising:
   a drift layer that is a first conductivity type and has a first surface and a second surface;
   a semiconductor device structure disposed on a first surface side of the drift layer; and
   a high concentration region that is the first conductivity type, that has an impurity concentration that is higher than that of the drift layer, and that is disposed in the active region and on a device structure side of the drift layer,
   wherein the high concentration region is not disposed in the edge termination structure, and
   wherein the semiconductor device structure includes:
      a second-conductivity-type semiconductor region that is disposed on the first surface of the drift layer,
      a first-conductivity-type region that penetrates the second-conductivity-type semiconductor region in a direction of depth and reaches the high concentration region is disposed inside the second-conductivity-type semiconductor region,
      a first-conductivity-type semiconductor region that is disposed inside the second-conductivity-type semiconductor region at a position away from the first-conductivity-type region,
      a gate insulating film that is disposed contacting a portion of the second-conductivity-type semiconductor region, the portion located between the first-conductivity-type region and the first-conductivity-type semiconductor region, and
      a gate electrode that is disposed sandwiching the gate insulating film, on an opposite side of the first-conductivity-type semiconductor region, and
   wherein the high concentration region is disposed near an interface with the second-conductivity-type semiconductor region.

2. The semiconductor device according to claim 1, wherein
   the high concentration region is a barrier region that suppresses movement of minority carriers that move from a second surface side of the drift layer, toward the first surface side.

3. The semiconductor device according to claim 1, wherein
   the high concentration region is a spread region that spreads in a direction parallel to the first surface of the drift layer, carriers that move from the first surface side of the drift layer, toward a second surface side.

4. The semiconductor device according to claim 1, wherein the first surface and the second surface of the drift layer are at different elevations.

5. The semiconductor device of claim 4, wherein the first surface and the second surface of the drift layer face a same direction.

6. The semiconductor device according to claim 1, wherein an upper surface of the high concentration region is located above the second surface of the drift layer, and the lower surface of the high concentration region is located at an elevation below the second surface of the drift layer.

7. The semiconductor device according to claim 1, wherein the high concentration region borders the first surface of the drift layer and the high concentration region borders a side surface of the drift layer extending between the first surface and the second surface of the drift layer.

* * * * *